US006347058B1

(12) United States Patent
Houghton et al.

(10) Patent No.: US 6,347,058 B1
(45) Date of Patent: Feb. 12, 2002

(54) SENSE AMPLIFIER WITH OVERDRIVE AND REGULATED BITLINE VOLTAGE

(75) Inventors: Russell J. Houghton, Essex Junciton; Christopher P. Miller, Underhill, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/574,806

(22) Filed: May 19, 2000

(51) Int. Cl.[7] ................................................ G11C 7/00
(52) U.S. Cl. ...................... 365/203; 365/204; 365/149; 365/189.09
(58) Field of Search ................................. 365/203, 204, 365/205, 207, 208, 222, 226, 189.09, 149

(56) References Cited

U.S. PATENT DOCUMENTS

| | | | |
|---|---|---|---|
| 5,093,808 A | 3/1992 | Foss | 365/203 |
| 5,255,224 A | * 10/1993 | Galbi et al. | 365/189.09 |
| 5,398,207 A | * 3/1995 | Tsuchida et al. | 365/226 |
| 5,703,819 A | 12/1997 | Gotoh | 365/203 |
| 5,745,423 A | 4/1998 | Tai | 365/203 |
| 5,768,200 A | 6/1998 | Liu et al. | 365/203 |
| 5,777,935 A | 7/1998 | Pantelakis et al. | 365/203 |
| 5,790,466 A | 8/1998 | Hotta | 365/203 |

(List continued on next page.)

OTHER PUBLICATIONS

Kono, Takashi, et al., "A Precharged–capacitor–Assisted Sensing (PCAS) Scheme with Novel Level Controller for Low Power DRAMs," 1999 Symposium on VSLI Circuits Digest of Technical Papers, pp. 123–124.

Kirihata, T., et al., "A Pulsed Sensing Scheme With A Limited Bit–Lie Swing," IBM Research, Tokyo Res. Lab., IBM Japan, Ltd., pp. 63–64, and Figs.

Kirihata, T., et al., "A 14–ns 4–Mb CMOS DRAM with 300–mW Active Power," IEE J. of Solid State Circuits, vol. 27, No. 9, Sep. 1992, pp. 1222–1228.

Scheuerlein, R.E., et al., "A Pulsed Sensing Scheme with a Limited Bit–Line Swing," IEEE J. of Solid–State Circuits, vol. 27, No. 4, Apr. 1992, pp. 678–682.

Asakura, M., et al., "An Experimental 256–0Mb DRAM with Boosted Sense–Ground Scheme," IEEE J. of Solid–State Circuits, vol. 29, No. 11, Nov. 1994, pp. 2303–1309.

*Primary Examiner*—David Nelms
*Assistant Examiner*—Gene N. Auduong
(74) *Attorney, Agent, or Firm*—Connolly Bove Lodge & Hutz; Robert Walsh, Esquire

(57) ABSTRACT

In many DRAM (Dynamic Random Access Memory) architectures, a sense amplifier detects and amplifies a small voltage differential between complementary bitline pairs to read from/write to a DRAM memory cell. The access speed of the DRAM is dependent on the speed of the transition, due to this amplification, of the bitline pairs from an equalized, pre-charged voltage level to final (within a given sensing cycle) high and low levels. The transition speed of the bitline pairs can be increased by providing a higher overdrive voltage to the sense amplifier. As DRAM technologies are scaled successively smaller, the overdrive voltage must be controlled to avoid compromising the reliability of the DRAM. Accordingly, the present invention relates to a DRAM circuit which provides a transiently higher overdrive voltage only during sensing. The overdrive is provided by a pre-charged capacitive source utilizing the circuit's natural capacitance. The pre-charged capacitive source and the high-going bitline are coupled to a common node during sensing. The amount of capacitance and the level of pre-charge voltage are determined so as to arrive at a target voltage on the common node. The target voltage may be adjusted so as to achieve the correct write-back voltage for the high-going bitline.

30 Claims, 6 Drawing Sheets

U.S. PATENT DOCUMENTS

| | | |
|---|---|---|
| 5,815,451 A | 9/1998 | Tsuchida .................... 365/203 |
| 5,828,609 A | 10/1998 | Li et al. ...................... 365/203 |
| 5,828,610 A | 10/1998 | Rogers et al. .............. 365/203 |
| 5,872,737 A * | 2/1999 | Tsuruda et al. ........ 365/189.05 |
| 5,875,139 A | 2/1999 | Semi .......................... 365/203 |
| 5,970,010 A * | 10/1999 | Hira et al. .................. 365/226 |
| 6,140,805 A * | 10/2000 | Kaneko et al. ............. 323/280 |
| 6,215,349 B1 * | 4/2001 | Hanson et al. ............. 327/390 |

* cited by examiner

SENSE AMPLIFIER WITH OVERDRIVE AND REGULATED BITLINE VOLTAGE

BACKGROUND OF THE INVENTION

The present invention relates to a sense amplifier, typically as part of a DRAM (Dynamic Random Access Memory) array, having a transiently higher overdrive voltage for increased sensing speed provided by a capacitive charge source, and bitline voltage regulation during sensing.

DRAM arrays are memory devices widely used in a variety of computer-related applications. In many DRAM architectures, the access speed of a DRAM is directly tied to the speed of the transition of complementary bitline pairs from an equalized, pre-charged voltage level to final (within a given sensing cycle) high and low levels, and is an important performance parameter for a DRAM. Typically, the faster the access speed of a DRAM, the more useful and commercially popular it is as a product. Accordingly, much research and development is devoted to increasing this speed of transition, also referred to as the sensing speed or signal development speed.

FIG. 1 shows an example of a known circuit which is typically a basic component of a DRAM. Sense amplifiers 104 and 105 connect complementary bitline pairs BLA, /BLA and BLB, /BLB, respectively, which are connected to memory cells 100–103. To read from/write to selected memory cells, a memory cell address is input to row/column decoders (not shown) which generate signals to activate a selected wordline and bitline corresponding to the address. In a read operation, the selected bitline and its complement output a small differential voltage value representing a logic "0" or "1" in response to the signals. The sense amplifiers amplify the differential voltage value to a full logic level for output to the required application.

FIG. 2 shows a timing diagram (time vs. voltage) corresponding to a read by the circuit of FIG. 1. In particular, the curves labeled BLA and /BLA represent the voltage levels acquired, respectively, by bitlines BLA and /BLA during a sensing and amplifying period initiated in response to a wordline, WLA, being selected as described above. The rate at which the curves BLA and /BLA rise or fall from a pre-charged, equalized state (½ VBLH), to a desired final voltage (VBLH) for the high-going bitline, and a voltage at or near ground for the low-going bitline, represents a sensing or signal development speed which it is desirable to optimize as described above.

In FIG. 2, more particularly, a DRAM access is triggered by the /RAS (Row Address Strobe complement) signal going low. In response, the EQL signal goes low, ending a pre-charged condition for the bitlines and the SLP and SLN signal lines at ½ VBLH, maintained by equalizing devices 106. As the selected wordline WLA goes high, the access transistor of the memory cell 100 begins to conduct, and the storage capacitor begins to charge-share with BLA. The capacitor has been preset either to a low voltage (near ground), typically representing a logic "0", or a high voltage (near VBLH) typically representing a logic "1".

After a small differential voltage Δv has developed between BLA and /BLA as a result of the charge-sharing, a sensing operation is initiated by driving the SEP signal low and the SEN signal high to activate the sense amplifier 104. This connects the SLP line with a voltage at the VBLH level and the SLN line with a voltage at or near ground.

As is understood in the art, the PFETs and NFETs of the sense amplifier conduct in a sequence corresponding to whether the bitline connected to the memory cell is high-going or low-going with respect to its complementary bitline, as a result of charge-sharing with the memory cell. Thus, as the SLP line is pulled toward VBLH from ½ VBLH, the high-going bitline is pulled toward VBLH, and as the SLN line is pulled toward ground from ½ VBLH, the low-going bitline is pulled toward ground as shown on the BLA, /BLA time axis. At a point after the transistors of the sense amplifier begin to conduct, the sense amplifier is said to have "set" or "latched".

It is recognized in the art that one way to increase the speed of transition of the bitline voltages is to provide a higher "overdrive" voltage to the transistors of the sense amplifier via the SLP and SLN lines. "Overdrive" as used herein refers to an amount of voltage in excess of a gate-to-source threshold voltage of a transistor. For example, if a voltage of 1 volt is applied gate-to-source to a transistor having a gate-to-source threshold voltage of ½ volt, ½ volt of the applied voltage is overdrive voltage. As is known, the amount of overdrive voltage applied to a transistor determines the amount of current the transistor will supply. In a saturated mode in which the transistors of the sense amplifier operate during sensing, the greater the overdrive voltage applied, the greater the current delivered by the transistors. Because the transistors are charging and discharging the bitlines, the greater current enables a faster voltage transition on the bitlines.

Providing a higher overdrive voltage as described above has posed problems as "technology scaling" has occurred in DRAM designs. Technology scaling refers to making all DRAM features smaller so as to pack bits more densely on a silicon chip. However, voltages must be scaled commensurately with feature size; voltages that are too high tend to break down the thinner films and insulators of the scaled-down structures. DRAMs also usually include wear-out mechanisms that, when scaled smaller, wear out earlier at lower voltages. Therefore, voltages in general cannot be kept at a consistently higher level.

Accordingly, techniques have been proposed for applying higher overdrive voltage transiently during sensing to increase sensing speed, but otherwise keeping voltage levels at a scale better suited for smaller DRAM structures. However, these techniques do not address the need for stabilizing and precisely controlling the final voltage of the overdriven bitline in an end period of a sensing cycle.

Such stability and precise control are highly desirable for several reasons. For instance, typically of the art, the read operation described above is "destructive"; i.e., the charge of the memory cell is disturbed by charge-sharing with the bitlines, and consequently the charge must be refreshed after each read operation by a "write-back" operation, which re-impresses the final bitline voltage on the memory cell. If the correct final bitline-high voltage is undershot, less than the correct amount of charge for representing a data "1" will be written back to the memory cell during the refresh stage. On the other hand, if the correct final bitline-high voltage is overshot, the reliability of the cell is compromised because write-back will place too high an electric field across its oxide.

Control of final bitline voltage is also important because of factors present in a typical DRAM array which tend to cause unpredictable and undesired variations in the final bitline voltage. For instance, variations in the DRAM fabrication process such as image size and oxide thickness will cause key components of bitline capacitance to vary from chip to chip. These key components, for example, include the cell device drain junction and gate overlap capacitance plus wiring capacitance. The variations of these components of bitline capacitance present problems when charge sharing is utilized to set the bitline high voltage level after sensing.

The data state of the DRAM cells also affects the total charge that must be supplied in sensing, and consequently affects the final bitline voltage. This can be seen by observing that the charge level of the high-going bitline of a bitline pair may start from either of two points once sensing begins. One point is the equalized, pre-charged level (½ VBLH in the case described above), and the other is the equalized, pre-charged level, plus a small charge increment developed from charge-sharing with a memory cell storing a "1", as illustrated by the positive Δv shown in the example of FIG. 2. Charging up the high-going bitline from the former point requires more charge than charging up from the latter point. Thus, in an entire DRAM array, typically comprising thousands of sense amplifiers, different data states can require significantly different amounts of charge to sense, amounts fluctuating by 10 to 20 percent of a median charge amount. Such a fluctuation must be accounted for to have a stable final bitline voltage.

In view of the foregoing, it is an object of the present invention to efficiently realize an improved DRAM circuit providing higher sense amplifier overdrive for increased sensing speed and a well-controlled final bitline voltage.

SUMMARY OF THE INVENTION

In a circuit according to the present invention, a DRAM sense amplifier is provided with a transiently higher overdrive voltage from a pre-charged capacitive source during a sensing period, to increase signal development speed without using consistently higher voltages.

In a preferred embodiment, a node of the circuit is common to the capacitive source and the high-going bitline during sensing. The amount of capacitance for the source and its pre-charge voltage are determined so that after the overdrive voltage has been delivered, the sense amplifier has set, and charge has been shared between the pre-charged capacitive source and the high-going bitline of the sense amplifier, the common node acquires a target voltage which is near a desired final voltage for the high-going bitline. A voltage regulation system may then source or sink current as needed to bring the common node to the desired final voltage, which is ultimately acquired by the high-going bitline, due to its connection with the common node via the set sense amplifier.

The foregoing circuit enables efficiencies to be realized by utilizing parasitic capacitance naturally present in a DRAM as the capacitive charge source. Further, the voltage regulation system ensures that the correct final high bitline voltage is always written back to the storage capacitor.

DETAILED DESCRIPTION OF THE INVENTION

Figure 3:
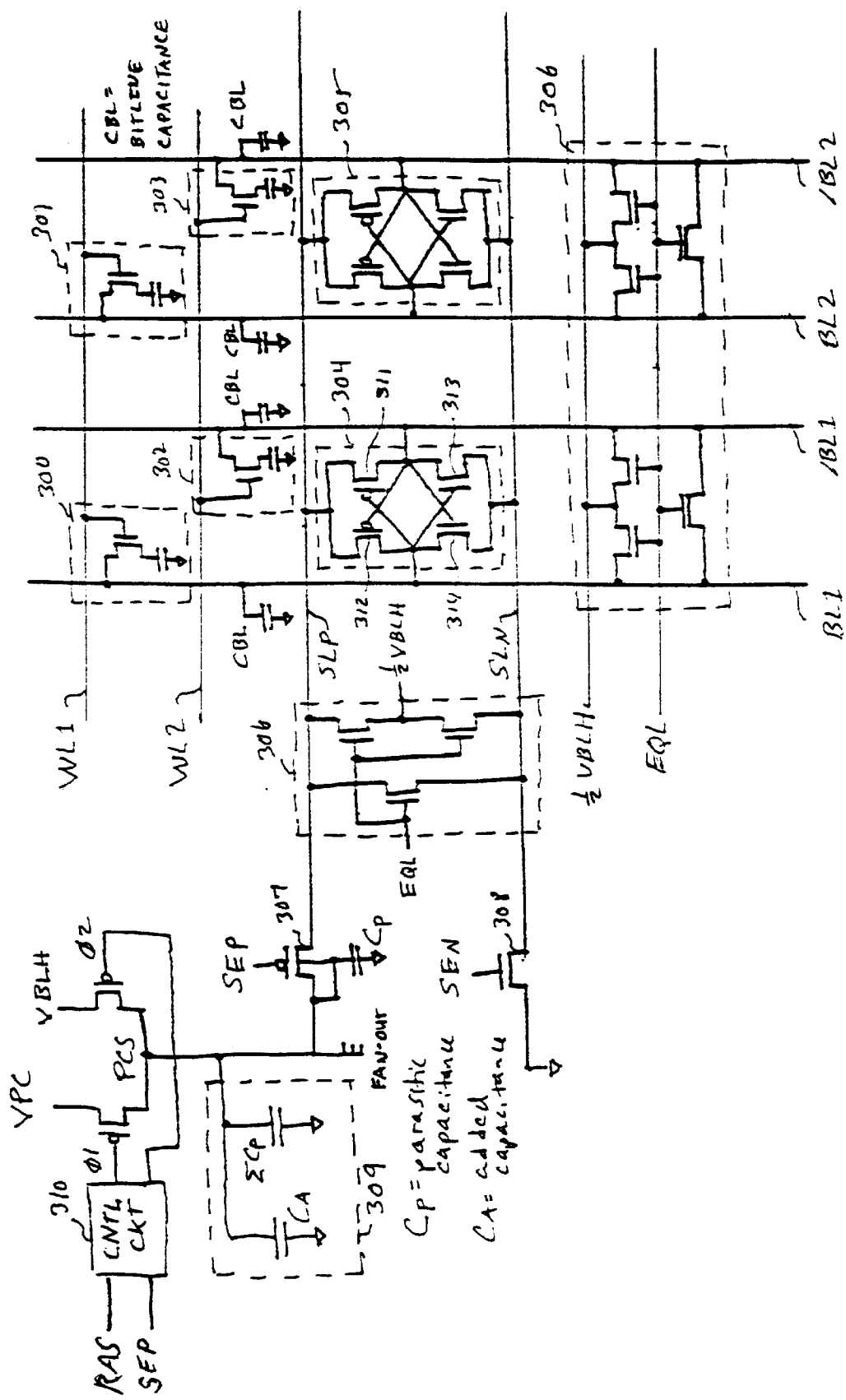
FIG. 3 shows a circuit according to the present invention.

FIG. 3 shows an example of a circuit according to the present invention. The circuit represents an illustrative portion of a DRAM array, which would typically comprise a plurality numbering in the thousands of the components shown in FIG. 3. The circuit comprises wordline WL1 coupled to memory cells 300 and 301, and wordline WL2 coupled to memory cells 302 and 303. The memory cells comprise access transistors coupled to storage capacitors. Elements designated CBL represent the inherent capacitance of bitlines BL1, /BL1, BL2 and /BL2.

Signal lines SLP and SLN are wires coupled to a PFET (P-type Field Effect Transistor) side and a NFET (N-type FET) side, respectively, of sense amplifiers 304 and 305. The SLP and SLN lines are used to activate the sense amplifiers for a sensing operation, to read from or write to memory cells 300–303 when selected by the corresponding wordline.

The sense amplifiers may be embodied as cross-coupled CMOS (Complementary Metal-Oxide Semiconductor) latches. The sense amplifiers 304 and 305 are further coupled to complementary bitline pairs BL1 and /BL1, and BL2 and /BL2, respectively.

Equalizing devices 306 comprise transistors having an EQL signal as their gate inputs. While the EQL signal is high, the transistors conduct, connecting their respective complementary bitline pairs and the SLP and SLN lines. The equalizing devices maintain these lines at the same voltage level, for example, ½ VBLH, during pre-charge or quiescent periods; i.e., while the memory cells are not being accessed and the sense amplifiers are consequently inactive.

The SEP and SEN signals activate the sense amplifiers when the memory cells are accessed, as described in greater detail below. During pre-charge periods, the SEP and SEN signals are at or below the threshold of transistors 307 and 308, de-coupling the SLP and SLN lines from the node labeled PCS in FIG. 3, and ground, respectively.

The PCS node is coupled to a pre-charge capacitance 309, voltage control circuit 310, a pre-charge voltage source VPC, and voltage source at the VBLH level.

Figure 4:
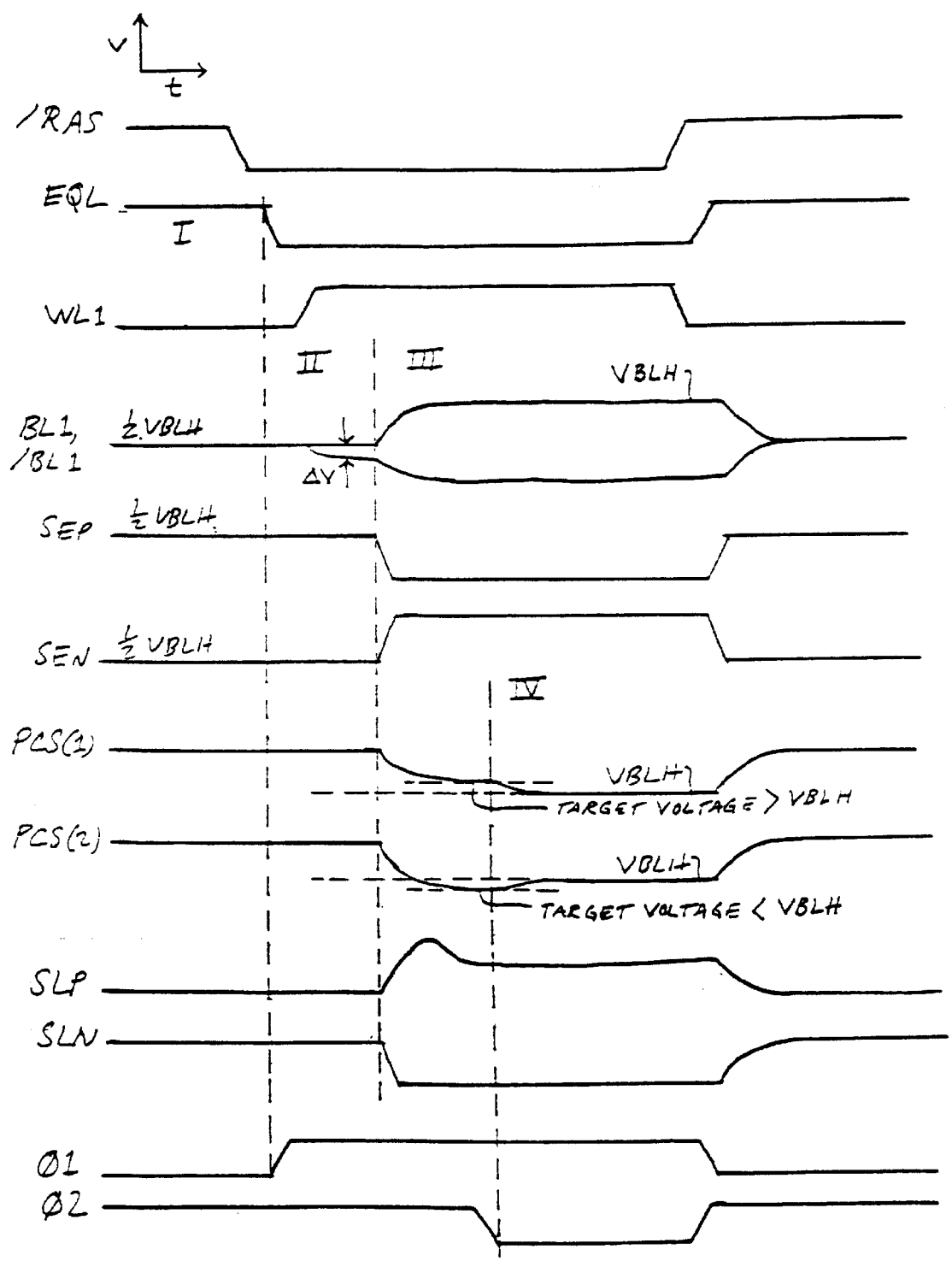
FIG. 4 shows a timing diagram corresponding to the circuit of FIG. 3.

FIG. 4 shows a timing diagram corresponding to a read operation, of memory cell 300, by the circuit of FIG. 3. The BL1 and /BL1 bitlines are initially at an equalized level of ½ VBLH, as are the signal lines SLP and SLN.

According to the present invention, the PCS node is pre-charged to a voltage VPC which is higher than VBLH, to provide a transiently higher overdrive voltage during sensing from charge supplied by pre-charge capacitance 309. The level of VPC and amount of pre-charge capacitance 309 are controlled to arrive at a target voltage for the PCS node. The voltage of the PCS node may subsequently be regulated upward or downward from the target voltage to VBLH. The voltage of the high-going bitline will follow the PCS node because it is connected to the PCS node through transistors operating in a linear mode when the sense amplifier 304 has set.

The read operation is triggered by /RAS going low. In response, the EQL signal goes low, ending a pre-charge period I by causing the equalizing devices 306 to turn off and thereby float or disconnect the equalized bitlines and signal lines.

Subsequently, wordline WL1 goes high, turning on the access transistor in memory cell 300 and causing the storage capacitor to begin charge-sharing with BL1. In the example illustrated on the BL1, /WL1 time axis, the storage capacitor stores a low voltage, as reflected by the negative Δv in the charge level of BL1.

After a period II for allowing Δv to develop, the sense amplifiers are activated during a period III to sense and amplify the voltage differential, by lowering the SEP signal and raising the SEN signal. This causes transistors 307 and 308 to conduct, connecting the SLP line with the PCS node and the SLN line with ground.

The PFETs 311–312 and NFETs 313–314 of the sense amplifier 304 detect and amplify the voltage differential between BL1 and /BL1. Since the gates and sources of the transistors are all at ½ VBLH during the pre-charge period I, initially the transistors are effectively cut-off; i.e., they have less than a threshold voltage from gate to source. In the case of the two NFETs 313–314, as sensing begins and the SLN line is pulled toward ground, the transistor having the higher voltage gate-to-source conducts sooner than the transistor having the lower-going voltage, and the low-going bitline (BL1 in this case) is discharged through the conducting transistor into the SLN node.

Concurrently, as the SLP line is pulled positively toward the voltage at the PCS node, one of the PFETs 311–312 conducts earlier than the other, and the bitline that is more positively charged (/BL1, since it remained at essentially ½ VBLH) is charged through the conducting transistor toward the PCS voltage.

Figure 1:
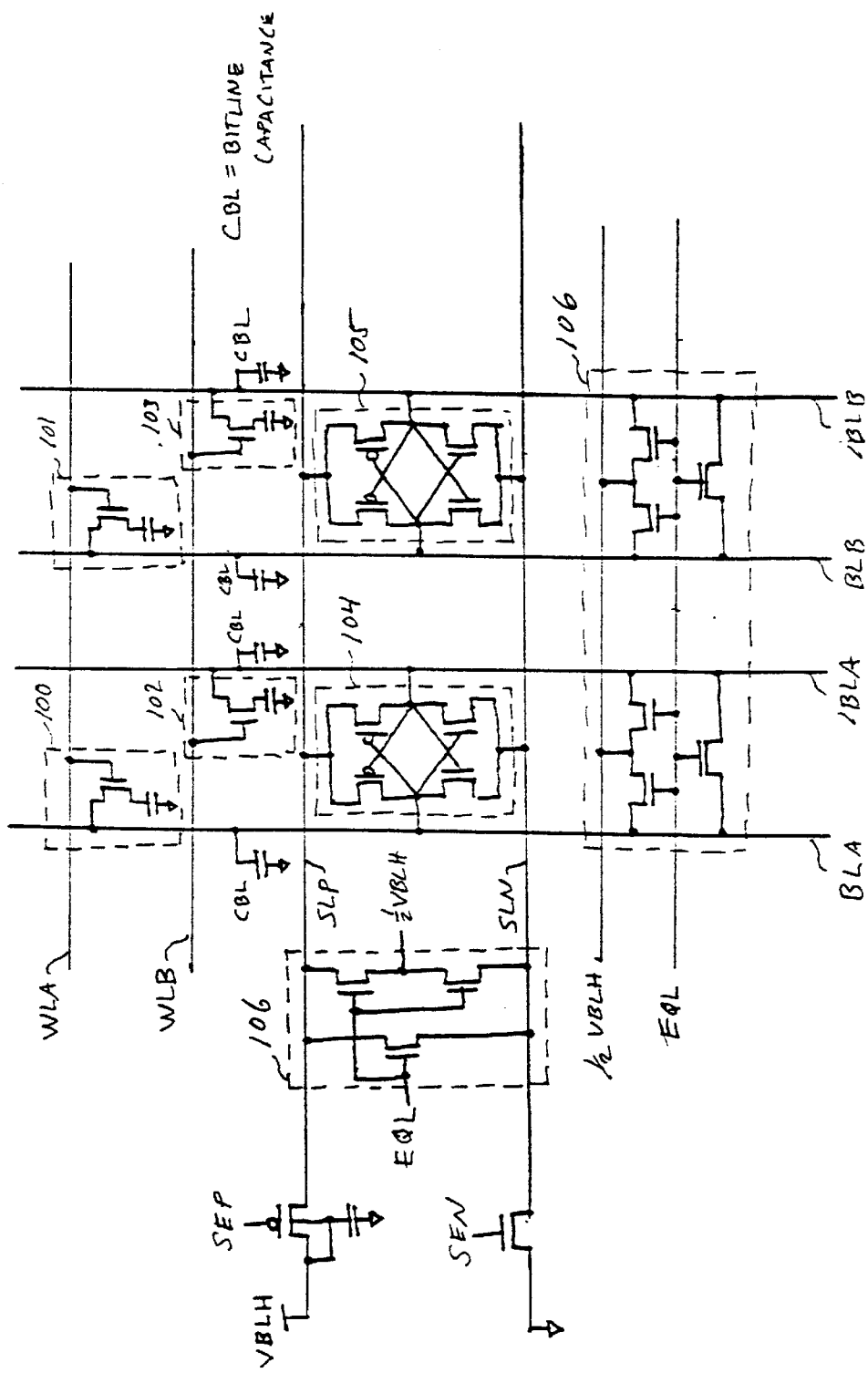
FIG. 1 shows an example of a prior art DRAM circuit.
Figure 2:
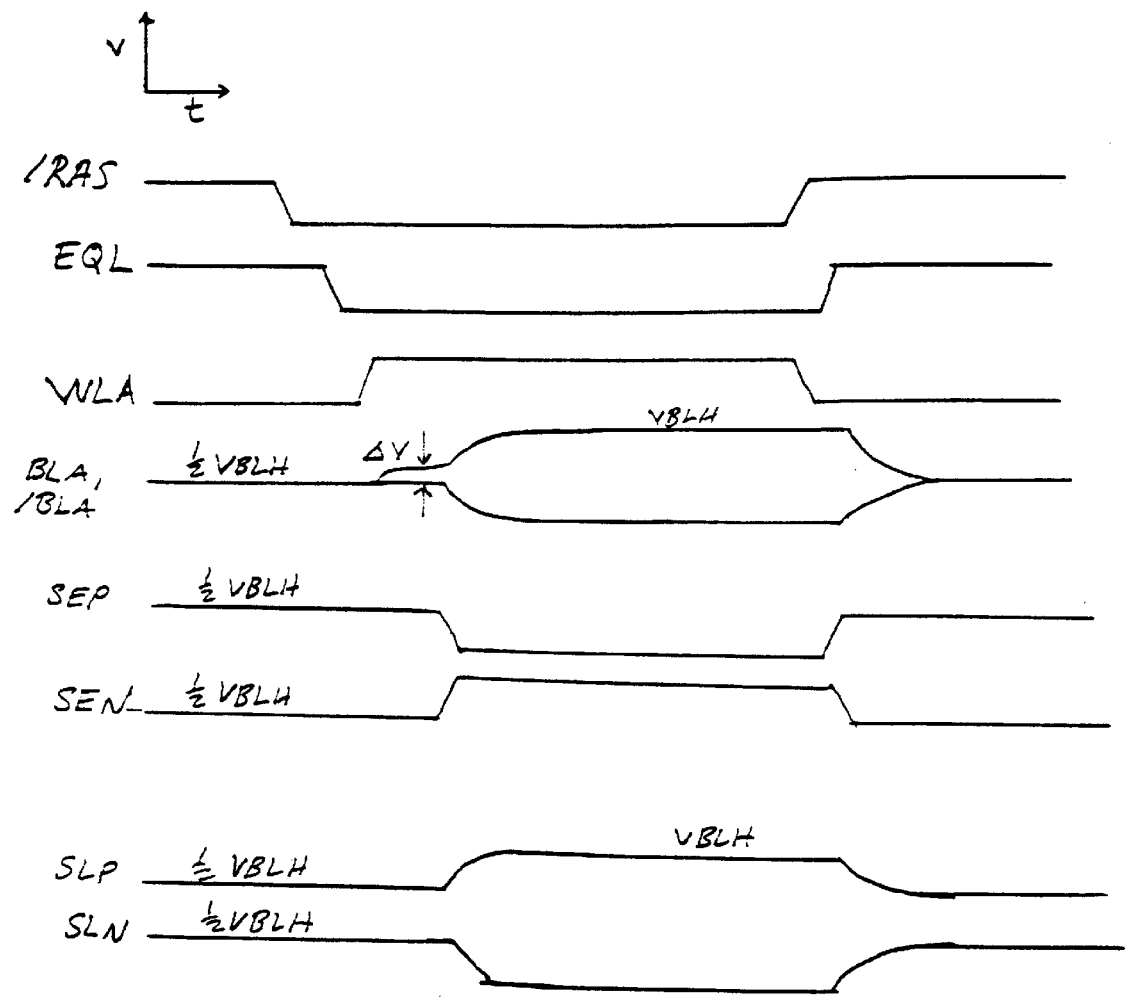
FIG. 2 shows a timing diagram for input and output signals of the circuit of FIG. 1.
Figure 5:
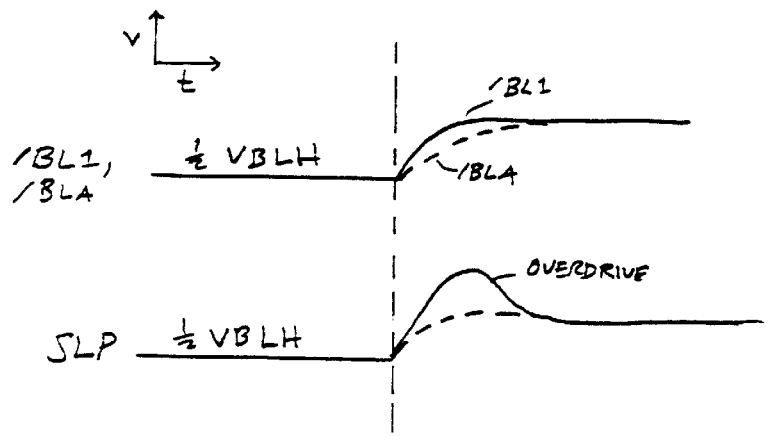
FIG. 5 illustrates the effect of higher overdrive on the sensing speed of a sense amplifier.

As shown on the correspondingly labeled axes, charge stored by the pre-charge capacitance connected to the PCS node discharges onto the SLP line, to increase the overdrive to the conducting PFET of the sense amplifier for faster sensing. FIG. 5, while not specifying any particular quantities, illustrates generally the effect of the higher overdrive on the rate of signal development on the high-going bitline, /BL1, as compared to, for example, /BLA of FIG. 1 (assuming a case where /BLA goes high) which has lower overdrive. As can be seen, the signal on the bitline having the higher overdrive rises at a faster rate.

As noted above and shown on time axes labeled PCS(1) and PCS(2), according to the present invention, the PCS voltage is controlled so that as charge-sharing proceeds among the PCS node, the SLP line and the high-going bitline, the PCS voltage reaches a target voltage during the sensing period III. The target voltage may be higher than VBLH, as shown on axis PCS(1), and subsequently regulated downward during an adjustment period IV.

The target voltage may also be a voltage which lower than VBLH, and is subsequently regulated upward to VBLH, by supplying an adjustment amount of current during a post-charge-sharing adjustment period IV as shown on axis PCS(2).

The pre-charge capacitance 309, voltage control circuit 310 having input signals /RAS and SEP and output signals φ1 and φ2, pre-charge voltage source VPC, and VBLH voltage supply shown in FIG. 3 are used for controlling the PCS target voltage and performing a subsequent regulation if necessary. Depending on design constraints and trade-offs as discussed in greater detail below, the PCS target voltage may be regulated both upward and downward, or only downward, or only upward, or not regulated at all.

Figure 7:
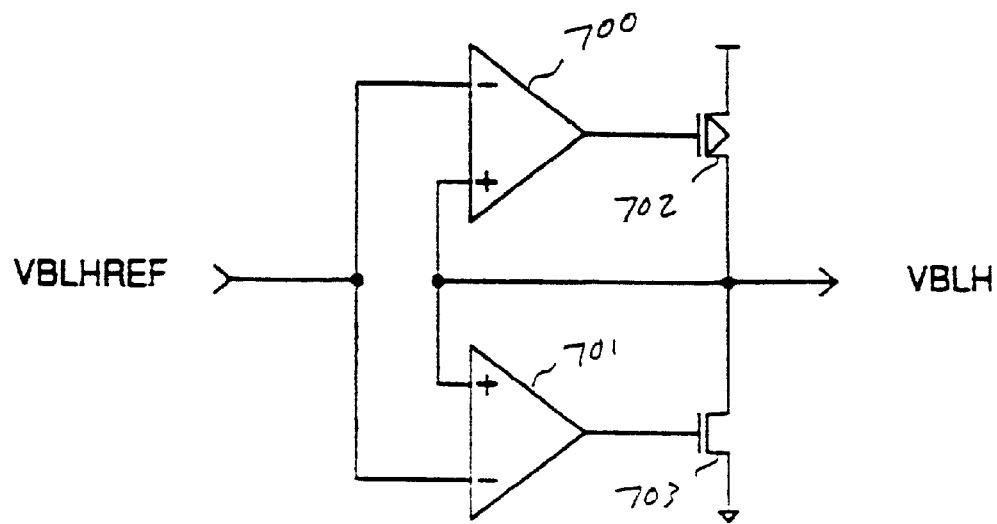
FIG. 7 shows a circuit for providing a VBLH supply voltage.

The φ1 signal from control circuit 310 is low during pre-charge period I to pre-charge the PCS node to the VPC level. As a result of the /RAS input, the φ1 signal rises as EQL falls to disconnect the PCS node from VPC, ending the pre-charge period. For bidirectional voltage regulation, once charge stored in the pre-charge capacitance 309 at the PCS node has discharged into the SLP line, so that the PCS node arrives at the target voltage at some point during the sensing period III, the φ2 signal is activated as a result of the SEP high-to-low transition to connect the PCS node to the voltage source at VLBH to regulate the PCS node to the VBLH level in the required direction. FIG. 7, described in greater detail below, shows a regulator for the VBLH supply shown in FIG. 3 which can either source or sink current as needed to regulate upward or downward. Thus, the high-going bitline ultimately acquires the desired final value of VBLH, within the adjustment period IV, due to its connection with the PCS node via the SLP line and latched sense amplifier.

In regulating the PCS voltage as described above, it is desirable to minimize the regulation requirements on the VBLH supply during the setting phase (period III), since this results in reducing the current transients and noise during this phase. The following describes an approach for controlling the degree to which the target voltage is offset from he desired final bitline voltage to achieve such minimal regulation requirements. The approach is applicable to cases where the voltage regulation is either bi-directional or one-directional.

Given fixed conditions, the PCS target voltage may be made arbitrarily close to a desired final high bitline voltage by the choice of a pre-charge capacitance 309 and pre-charge voltage VPC. However, as noted above, in general the PCS target voltage will stray from the desired final high bitline voltage while charge sharing because of capacitance mismatches between the capacitance 309 on the PCS node and bitline capacitances due to manufacturing variations, and due to different data patterns.

The process-induced variation effects on the PCS target voltage can be eliminated during the manufacturing phase, since the process-induced effects are fixed once the DRAM has been fabricated. For example, during a manufacturing test phase which is normally performed after fabrication, the PCS target voltage can be measured directly on the VBLH voltage net by disabling the VBLH supply and measuring the VBLH voltage at the end of the setting phase (period III). Then, depending upon whether the measured voltage is above or below the target, the VPC voltage can be trimmed up or down using known methods of supply trimming. For example, one known method is to blow fuses on the DRAM to set VPC to a desired value. Thus, the PCS target voltage can be adjusted by a choice of VPC voltage and the pre-charge capacitance 309. Charge supplied by the VBLH supply needs only to account for PCS voltage variations due to varying data patterns. This reduces the demand on the VBLH supply to a minimum, and compensates for capacitance mismatching between the PCS node capacitance and the bitline capacitances in the charge-sharing sense system described above.

The PCS node pre-charge capacitance 309 is represented by a parasitic capacitance $C_P$ and an added lumped capacitance $C_A$. $C_P$ is a fan-out capacitance constituted substantially by the summation of well-to-substrate capacitance of device 307 within a chosen array block size and all associated interconnect wiring capacitance. Well-to-substrate capacitance is a junction depletion capacitance subject to doping profiles in the DRAM fabrication process and will have a tolerance variation that does not track with bitline capacitance. $C_A$ is chosen to adjust pre-charge capacitance 309 as desired and may include a value of 0 (zero).

Since the total charge stored on the PCS node is determined by both the capacitance connected to the node and the pre-charge voltage VPC, the amount of pre-charge capacitance can be altered and the PCS pre-charge voltage can be changed to compensate so that the total stored pre-charge is unchanged. This enables embodiments where only the natural capacitance $C_P$ of the PCS node is utilized as the pre-charge capacitance 309, without adding lumped capacitance $C_A$, and the VPC voltage is adjusted higher to provide the proper amount of pre-charge. As the natural capacitance, for example, the SLP and SLN lines may be utilized. The SLP and SLN lines are typically large, long wires with much natural capacitance. Further, the PCS node may connect to a large global bus connected to many or all of the sense amplifiers in a DRAM, providing a great deal of inherent capacitance. Concurrently, in a preferred embodiment $C_A$ would be implemented in a most area-efficient manner by utilizing the same capacitor structure and technology as the memory cell.

In view of the above-described methods for implementing and controlling VPC and the pre-charge capacitance 309 to control a target voltage offset from VBLH, various modes of operating a circuit according to the present invention may be implemented, in consideration of existing or contemplated design constraints.

For example, in a DRAM design allowing for relatively wide signal margins, an acceptable write-back voltage could vary more, compared to designs with tighter constraints. In such a design, VPC and the pre-charge capacitance could be set so that a post-charge-sharing target PCS voltage as described above would not need any further regulation. Rather, the target voltage would always be within an acceptable range of write-back voltages which would be acquired by the high-going bitline.

In a design having somewhat tighter constraints than the afore-described design, regulation of the target voltage to a desired final bitline voltage would be performed. Such regulation might be in either direction; i.e., from a target voltage above a desired final bitline voltage, or from a target voltage below a desired final bitline voltage, using, for example, a voltage regulation system as shown in FIGS. 3 and 7. The demand on the voltage regulation system would be minimized by the appropriate selection of VPC and the pre-charge capacitance as described above.

In still another mode of operation, in a design having tighter signal margins, and where power efficiency was less important than better write-back and faster bitline transitions, VPC and the pre-charge capacitance could be set so that, after charge-sharing, the PCS node arrived at a target voltage that was always slightly higher than a desired final bitline voltage, and then regulated downward to the desired voltage. The embodiments shown in FIGS. 3 and 7 could implement such one-directional regulation In this mode of operation, the high-going bitline would arrive at the desired final voltage sooner, while expending slightly more power, than in other modes.

In still another mode of operation, the pre-charge capacitance and VPC would be selected so that the target voltage undershoots VBLH by some controlled amount and is subsequently adjusted upward to VBLH. This mode of operation could also be implemented, for example, by the circuits shown in FIGS. 3 and 7. An alternative voltage regulation system not requiring timing control is described in greater detail below for this mode of operation.

It may be appreciated that for the latter two modes of operation, voltage regulation is simplified in that it is one-directional; i.e., always upward or always downward. By tuning the PCS target voltage accurately as described above, it may be ensured that the PCS target voltage is always above or below the desired final high bitline voltage, but only slightly. Thus, the regulating requirement on the VBLH supply is minimized. This makes it possible to realize a bitline voltage regulating system which is simpler and smaller than a bidirectional system.

Figure 6:
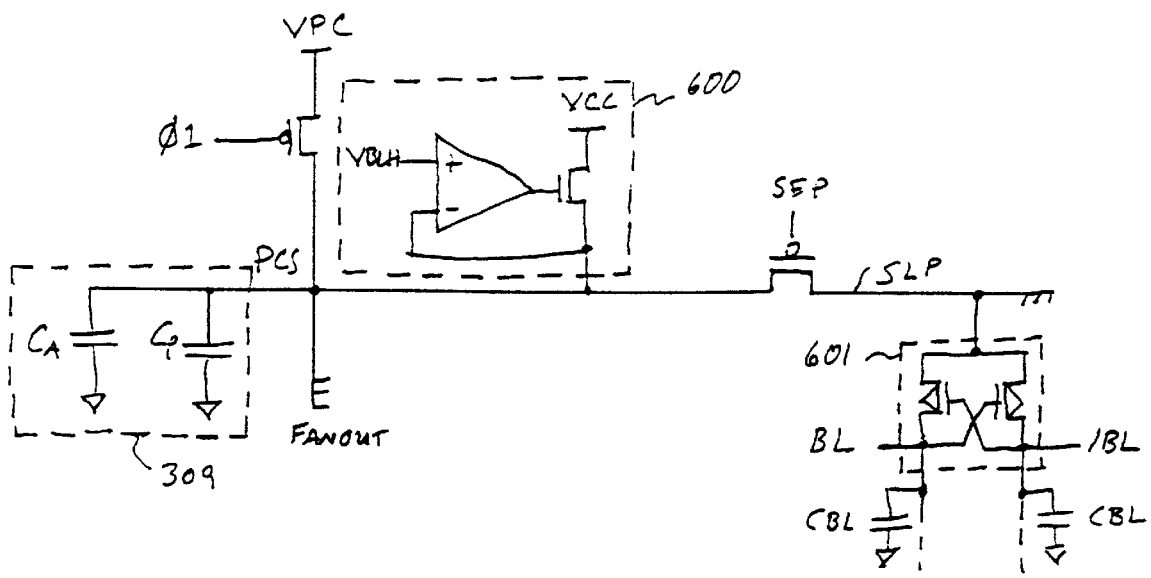
FIG. 6 shows an alternative embodiment of a voltage regulation system according to the present invention.

An alternative bitline voltage regulating system, not requiring timing control, is shown in FIG. 6. FIG. 6 shows a circuit including a feedback voltage regulator 600 for controlling the target PCS voltage to arrive at a desired final VBLH. The circuit comprises a PCS node linking the SLP line with a pre-charge capacitance 309 and pre-charge voltage VPC as in the above-described embodiment. An φ1 signal also operates as above, to maintain the PCS node at VPC during pre-charge or quiescent periods, and disconnecting VPC from the PCS node to discharge the pre-charge capacitance into the SLP line during sensing for higher overdrive. Also shown in FIG. 6 is a PFET side 601 of a sense amplifier constituting a cross-coupled latch as above, coupled to bitlines BL and /BL. The SEP signal activates the sense amplifier by connecting the SLP line with the PCS node during sensing.

The feedback voltage regulator 600 comprises an operational amplifier having VBLH as its positive input, and a feedback line coupled to the PCS node as its negative input. The operational amplifier output is coupled to a transistor connected between a supply voltage VCC and the PCS node.

The operation of the above circuit is as follows: during sensing, the SLP line is connected to the PCS node. Because, as described above, PCS target voltage is tuned to be slightly below VBLH, current is supplied by the feedback voltage regulator 600 to pull the SLP line up to a value of VBLH. Thus, in the above circuit, the final value of the voltage on the SLP line, and consequently of the final voltage on the high-going bitline, is controlled to have a desired value of VBLH. Further, the voltage regulation is uni-directional (upward) and requires no timing control, as noted above.

FIG. 7 shows an example of a circuit which could be used to provide the VBLH supply shown in FIGS. 3 and 6. This circuit outputs a regulated voltage VBLH from an input reference voltage VBLHREF which can source or sink current from the load connected to VBLH. Non-inverting voltage amplifier 700 drives the gate of PMOS 702 in a conventional CMOS feedback regulator arrangement to form the current sourcing half of the regulator. Similarly, amplifier 701 in conjunction with NMOS 703 provides the current sinking half. Input reference voltage VBLHREF is substantially equal to the regulated output voltage VBLH.

Figure 8:
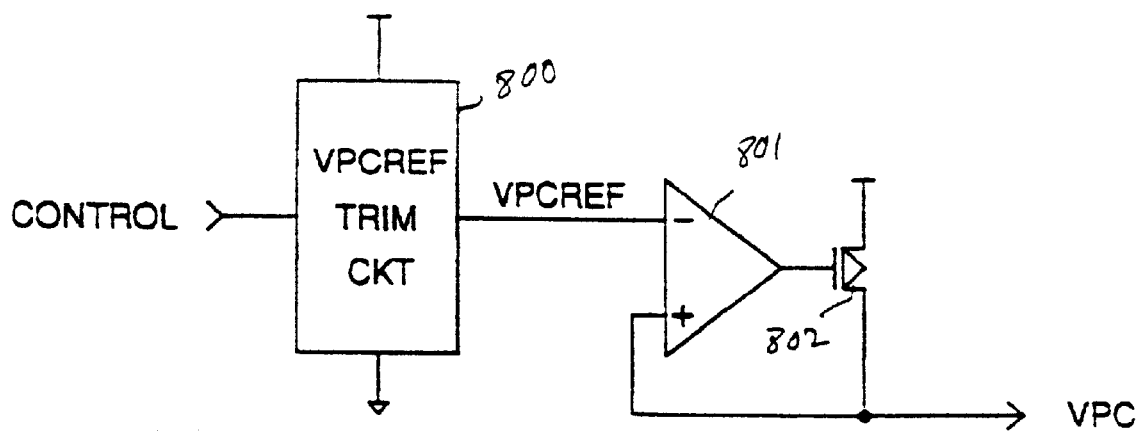
FIG. 8 shows a circuit for providing a pre-charge voltage VPC.

FIG. 8 shows an example of circuit for trimming VPC as desired. The trimmed reference voltage VPCREF is input to a conventional CMOS voltage regulator comprising amplifier 801 and PMOS 802 to provide an output voltage VPC substantially equal to VPC with current sourcing capability. VPCREF TRIM CKT 800 is a digital to analog converter which is constructed from circuit techniques well known by those skilled in the art. Binary digits at the control input during a test mode operation are converted to a corresponding analog reference voltage output VPCREF. VPCREF is then adjusted by varying the binary digits during test until the desired value is achieved. The desired value is then permanently saved on chip by programmable fuses.

VPC could be provided by an existing supply voltage on a DRAM chip which was also used by other circuits, or be independently regulated as described above. An advantage of using an adjustable VPC voltage independently regulated from a higher voltage supply as shown in FIG. 8 is that the initial PCS pre-charge voltage is not limited to voltage levels provided by existing lower voltage power supplies used by other elements on the DRAM chip. This means that the amount of transient overdrive provided to the transistors in the sense system of the DRAM array can be set independently of the other power supply voltages generated in the DRAM.

Because the above describes a complementary FET technology, it is noted that the foregoing also applies to technologies using an opposite polarity. For instance, the sense amplifiers could utilize NMOS transistors; in such a case, the overdrive voltage would be more negative than a gate-to-source threshold of the transistors, and other voltages, signals, signals and transistors would have the necessary corresponding polarity.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claim is:

1. A circuit comprising:
   a memory cell for storing a data value;
   a sense amplifier coupled to said memory cell; and
   a capacitive charge source coupled to said sense amplifier for providing a transiently higher overdrive voltage to said sense amplifier during a first period for sensing and amplifying said data value.

2. The circuit of claim 1, further comprising a pre-charge voltage source for charging said capacitive charge source to a selected level.

3. The circuit of claim 2, wherein said selected level is higher than a desired final bitline voltage for a bitline coupled to said sense amplifier.

4. The circuit of claim 3, wherein:
   during said first period, said capacitive charge source supplies an amount of charge to a node coupled to said bitline such that said node acquires a target voltage which is offset from said desired final bitline voltage.

5. The circuit of claim 4, wherein said target voltage is always above said desired final bitline voltage.

6. The circuit of claim 4, wherein said target voltage is always below said desired final bitline voltage.

7. The circuit of claim 4, further comprising voltage regulation means for regulating said node from said target voltage to said desired final bitline voltage during a second period following said first period.

8. The circuit of claim 7 wherein said voltage regulation means comprises a voltage source for sourcing or sinking current to or from said node.

9. The circuit of claim 7 wherein said voltage regulation means comprises an operational amplifier having said desired final bitline voltage as a first input and a feedback from said node as a second input.

10. The circuit of claim 2, wherein said pre-charge voltage source is common to other elements on a DRAM chip including said circuit.

11. The circuit of claim 2, wherein said pre-charge voltage source is independently regulated.

12. The circuit of claim 4, wherein said pre-charge voltage source is trimmed to control said offset.

13. The circuit of claim 1, said capacitive charge source comprising a distributed parasitic capacitance for said circuit.

14. The circuit of claim 13, said capacitive charge source further comprising an added lumped capacitance.

15. The circuit of claim 14, said added lumped capacitance comprising array capacitors of a DRAM (Dynamic Random Access Memory) array.

16. A method comprising:
   providing a capacitive charge source in a circuit including a sense amplifier and a memory cell storing a data value; and
   using said capacitive charge source to supply a transiently higher overdrive voltage to said sense amplifier during a first period for sensing and amplifying said data value.

17. The method of claim 16, further comprising using a pre-charge voltage source to pre-charge said capacitive charge source to a selected level.

18. The method of claim 17, wherein said selected level is higher than a desired final bitline voltage for a bitline coupled to said sense amplifier.

19. The method of claim 18, wherein:
   during said first period, said capacitive charge source supplies an amount of charge to a node coupled to said bitline such that said node acquires a target voltage which is offset from said desired final bitline voltage.

20. The method of claim 19, wherein said target voltage is always above said desired final bitline voltage.

21. The method of claim 19, wherein said target voltage is always below said desired final bitline voltage.

22. The method of claim 19, said circuit comprising voltage regulation means for regulating said node from said target voltage to said desired final bitline voltage during a second period following said first period.

23. The method of claim 22 wherein said voltage regulation means comprises a voltage source for sourcing or sinking current to or from said node.

24. The method of claim 22 wherein said voltage regulation means comprises an operational amplifier having said desired final bitline voltage as a first input and a feedback from said node as a second input.

25. The method of claim 17, wherein said pre-charge voltage source is common to other elements on a DRAM chip including said circuit.

26. The method of claim 17, wherein said pre-charge voltage source is independently regulated.

27. The method of claim 19, wherein said pre-charge voltage source is trimmed to control said offset.

28. The method of claim 16, said capacitive charge source comprising a distributed parasitic capacitance for said circuit.

29. The method of claim 28, said capacitive charge source further comprising an added lumped capacitance.

30. The method of claim 29, said added lumped capacitance comprising array capacitors of a DRAM (Dynamic Random Access Memory) array.

* * * * *